United States Patent
Watanabe

[11] Patent Number: 6,054,360
[45] Date of Patent: Apr. 25, 2000

[54] METHOD OF MANUFACTURING A SEMICONDUCTOR MEMORY DEVICE WITH A STACKED CAPACITOR WHEREIN AN ELECTRODE OF THE CAPACITOR IS SHAPED USING A HIGH MELTING POINT METAL FILM

[75] Inventor: Hirohito Watanabe, Tokyo, Japan

[73] Assignee: NEC Corporation, Tokyo, Japan

[21] Appl. No.: 08/869,254

[22] Filed: Jun. 4, 1997

[30] Foreign Application Priority Data

Jun. 4, 1996 [JP] Japan .................................. 8-141655

[51] Int. Cl.[7] .................................................. H01L 21/20
[52] U.S. Cl. .......................... 438/396; 438/239; 438/253; 438/254; 438/381; 438/397
[58] Field of Search ..................... 257/306, 307, 257/308; 438/3, 240, 253, 254, 396, 397, 398, 255

[56] References Cited

U.S. PATENT DOCUMENTS 5,168,073  12/1992  Gonzalez et al. ..................... 438/397
5,192,703  3/1993  Lee et al. ............................. 438/396
5,834,357  11/1998  Kang ..................................... 438/396

FOREIGN PATENT DOCUMENTS

| 595360 | 5/1994 | European Pat. Off. . |
| 4-264767 | 9/1992 | Japan . |
| 5-82750 | 4/1993 | Japan . |
| 6-29463 | 2/1994 | Japan . |
| 6-196649 | 7/1994 | Japan . |

*Primary Examiner*—Carl Whitehead, Jr.
*Assistant Examiner*—Toniae M. Thomas
*Attorney, Agent, or Firm*—Sughrue, Mion, Zinn Macpeak & Seas, PLLC

[57] ABSTRACT

The method of manufacturing a semiconductor memory device with a stacked capacitor is disclosed. The method is featured by forming an insulating film on semiconductor substrate, forming a high melting point metal film interposed between capacitor electrode films, selectively etching the capacitor electrode films to expose at least a part of the high melting point metal film, and removing the high melting point metal film by etching using a solution containing at least one selected from sulfuric acid, nitric acid, hydrochloric acid, phosphoric acid, hydrogen peroxide, and ammonia. Thus only the high melting point metal film can be removed without etching the insulating film.

31 Claims, 8 Drawing Sheets

METHOD OF MANUFACTURING A SEMICONDUCTOR MEMORY DEVICE WITH A STACKED CAPACITOR WHEREIN AN ELECTRODE OF THE CAPACITOR IS SHAPED USING A HIGH MELTING POINT METAL FILM

BACKGROUND OF THE INVENTION

1. Field of the Invention

The present invention relates to a method of manufacturing a semiconductor device, and more particularly to method of forming a capacitor electrode of a semiconductor memory device.

2. Description of the Related Art

Among semiconductor memory devices, a DRAM is known as being capable of arbitrarily outputting and inputting memory information. Since a memory cell in the DRAM having a structure composed of one transfer transistor and one capacitor is simple, it is widely used as most suitable one for higher integration of a semiconductor memory device.

For a capacitor of such a memory cell, a three-dimensional structure has been developed and used in accordance with further high integration of the semiconductor memory device. The reason why the capacitor has been formed into a three-dimensional structure is as follows. As semiconductor elements are made fine and are integrated in higher density, the contraction of an occupation area of a capacitor is inevitable. However, to secure a stable operation and reliability of the DRAM, it is necessary to secure a capacitance value larger than a certain value. For this purpose, the structure of an electrode of the capacitor is changed from a planar one to a three-dimensional one so that the surface area of the capacitor electrode is enlarged within the contracted occupation area.

There are a stack type capacitor and a trench type capacitor in the capacitors of three-dimensional structure of the memory cell of the DRAM. These structures have respectively merits and demerits. The stack type capacitor has high resistance against incidence of alpha rays or noises from circuits or the like, and stably operates even if the capacitance value is relatively small. Thus, it is considered that the stack type capacitor is effective even in a 1-gigabit DRAM in which a design standard of a semiconductor element is about 0.15 μm.

As the stack type capacitor (hereinafter referred to as stacked capacitor), a fin-structured capacitor or a cylinder-structured capacitor has been vigorously studied and various improvements have been added (see Japanese Laid-Open (Kokai) Patent Publication Nos. Hei. 6-29463 and 4-264767). Recent proposals for such a stacked capacitor will be described below.

FIG. 4A to FIG. 4F are sectional views showing a process of a fin-structured capacitor, which is disclosed in Japanese Laid-Open (Kokai) Patent Publication No. Hei. 5-82750 (hereinafter referred to as a first prior art).

As shown in FIG. 4A, a field oxide film 102 is selectively formed on the surface of a silicon substrate 101. A gate electrode 104 is formed through a gate oxide film 103 at a portion to become one cell region on the silicon substrate 101. Further, a first N$^+$ diffusion layer 105 connected to a bit line (not shown) and a second N$^+$ diffusion layer 106 to become a storage node are formed in the silicon substrate 101 at both the sides of the gate electrode 104 so that a transfer transistor is structured. It should be noted that a gate electrode wiring 107 on the field oxide film 102 is connected to a gate electrode of an adjacent other cell (not shown).

Next, a silicon oxide film is deposited by a chemical vapor deposition method (hereinafter referred to as CVD method) so that an interlayer insulating film 108 is formed. Further, a silicon nitride film is deposited on the interlayer insulating film 108 so that an etching stopper film 109 is formed. Then, a first SiO$_2$ spacer film 110 with a thickness of about 30 nm, a first N$^+$-type doped polysilicon film 111 with a thickness of about 20 nm, a second SiO$_2$ spacer film 112 with a thickness of about 30 nm, a second N$^+$-type doped polysilicon film 113 with a thickness of about 20 nm, and a third SiO$_2$ spacer film 114 with a thickness of about 30 nm are sequentially deposited.

As shown in FIG. 4B, the third SiO$_2$ spacer film 114, the second N$^+$-type doped polysilicon film 113, the second SiO$_2$ spacer film 112, the first N$^+$-type doped polysilicon film 111, the first SiO$_2$ spacer film 110, the etching stopper film 109, and the interlayer insulating film 108 are sequentially dry etched by a reactive ion etching method (hereinafter referred to as RIE). Then, a contact hole 115 passing through these films is formed so that the second N$^+$ diffusion layer 106 is exposed.

As shown in FIG. 4C, a third N$^+$-type doped polysilicon film 116 with a thickness of about 50 nm is formed on the inner surface of the contact hole 115 and on the third SiO$_2$ spacer film 114.

As shown in FIG. 4D, the SiO$_2$ spacer films 110, 112, and 114 and N$^+$-type doped polysilicon films 111, 113, and 116 laminated into a multilayer are finely processed by a photolithography technique and a dry etching technique to be patterned into a predetermined storage electrode shape 117.

As shown in FIG. 4E, the first, second and third SiO$_2$ spacer films 110, 112, and 114 are removed by a wet etching technique using a hydrofluoric acid base chemical solution. Here, the etching stopper film 109 serves to protect the interlayer insulating film 108 so as not to be etched.

In this way, a first layer fin 118, a second layer fin 119, and a third layer fin 120 are formed, then the storage electrode 121 of three-layered fin structure is formed.

As shown in FIG. 4F, a capacitor insulating film 122 is deposited on the surface of the storage electrode 121 of three-layered structure. Next, a fourth N$^+$-type doped polysilicon film is deposited and patterned by a dry etching process using the RIE so that a plate electrode 123 is formed. In this way, one transistor and one capacitor constituting a cell are formed.

A bit line (not shown) connected to the first N$^+$ diffusion layer 105 is formed in a subsequent step.

As described above, in the first prior art, when the silicon oxide films (110, 112, 114) used for shaping an electrode are removed, the silicon nitride film 109 is used as the etching blocking layer so that the interlayer insulating film is not etched. The silicon nitride film can be used because the etching rate thereof by hydrofluoric acid is lower than that of the silicon oxide film.

However, when the silicon nitride film is used as the etching blocking layer for the interlayer insulating film, such a problem occurs that cracks or voids are generated in the interlayer insulating film because of a large stress of the nitride film, so that device characteristics are degraded. Also, there is such a problem that since hydrogen is hard to be diffused into the nitride film, even if a hydrogen annealing treatment is performed after fabrication of a device, hydrogen is not diffused into the transistor portion so that defects in the substrate are hard to be recovered.

In order to solve these problems, a method of forming a stacked capacitor without using a silicon nitride film is disclosed in Japanese Laid-Open (Kokai) Patent Publication No. Hei 6-196649 (hereinafter referred to as a second prior art).

According to the second prior art, a silicon oxide film into which impurities such as phosphorus are introduced, is used as a film for shaping an electrode, a silicon oxide film including no impurities is used as the upper portion of an interlayer insulating film, and the oxide film for shaping the electrode is removed by a vapor phase HF etching treatment. This method uses the fact that in the vapor phase HF etching treatment process, an etching rate of the silicon oxide film including impurities such as phosphorus is extremely larger than that of the silicon oxide film including no impurities.

However, in the second prior art, the specific etching process of the vapor phase HF treatment is required and a specific apparatus therefor is also required. Further, the direction and the like of the HF gas flow must be strictly controlled, so that the cost is also increased.

SUMMARY OF THE INVENTION

It is therefore an object of the present invention to provide a method of manufacturing a semiconductor memory device, which is capable of solving the above described problems that the prior art involve.

A method of manufacturing a semiconductor memory device according to the present invention comprising the steps of:

forming an insulating film on a semiconductor substrate;

forming a high melting point metal film or a refractory metal film interposed between capacitor electrode films on said insulating film;

selectively etching at least one of said capacitor electrode films to expose at least a part of said high melting point metal film; and removing said high melting point metal film by wet etching using a solution containing at least one selected from sulfuric acid, nitric acid, hydrochloric acid, phosphoric acid, hydrogen peroxide, and ammonia.

According to this method, without providing an etching blocking layer on the insulating film formed at the lower portion of the capacitor electrode film, and without using a specific etching process, it becomes possible to etch only the high melting point metal film for shaping the capacitor electrode without etching the insulating film formed of a silicon oxide film or a silicon oxide film containing impurities.

BRIEF DESCRIPTION OF THE DRAWINGS

The above and other objects, advantages, and features of the present invention can be apparent from the following description taken in conjunction with the accompanying drawings, in which.

DETAILED DESCRIPTION OF THE INVENTION

Steps of forming a storage electrode according to a first embodiment of the present invention will be described with reference to a stacked capacitor of a cylinder structure.

Figure 1A:
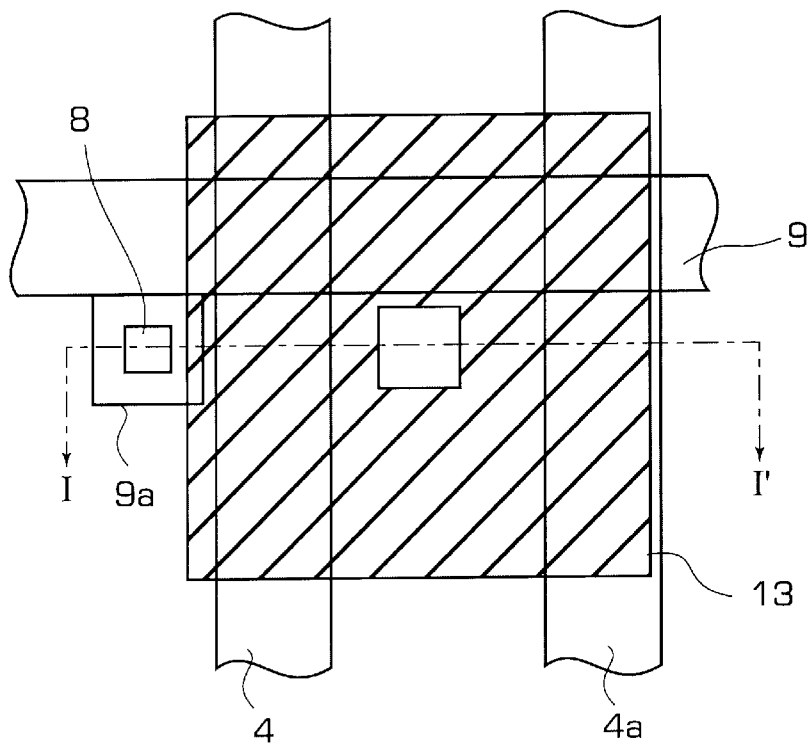
FIG. 1A is a plan view showing a DRAM cell fabricated by a first embodiment of the present invention.

FIG. 1A shows only structural elements positioned over a word line described later.

Figure 1B:
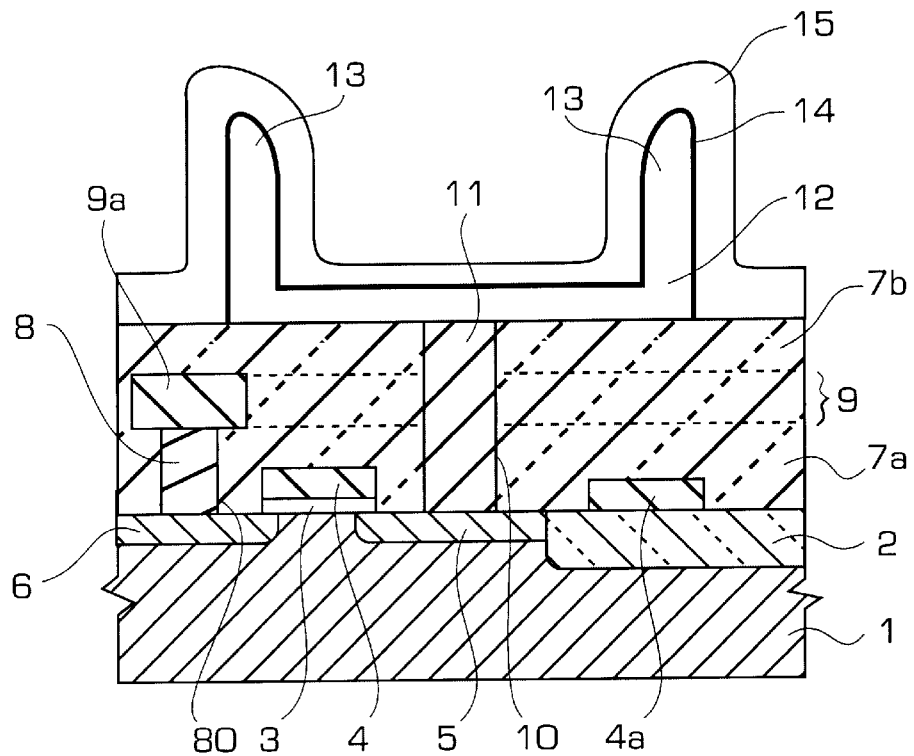
FIG. 1B is a sectional view showing the DRAM cell taken along line I-I' in FIG. 1A.

As shown in FIGS. 1A and 1B, a field oxide film 2 as an inactive region is selectively formed on a silicon substrate 1, so that a device active region surrounded by the field oxide film 2 is formed. A MOS transistor including a gate oxide film 3, a gate electrode 4, a capacitor diffusion layer 5, and a bit line diffusion layer 6 is formed on the device active region. This MOS transistor becomes a transfer transistor of a memory cell and accordingly, the gate electrode 4 is elongated as one word line. This word line 4a is formed on the field oxide film 2. The word line 4a is connected to a gate electrode of a transfer transistor of an adjacent memory cell (not shown). An interlayer insulating film 7a covers the gate electrode 4 and the word line 4a.

A bit line contact hole 80 is opened on the bit line diffusion layer 6 of the MOS transistor, and a bit line contact plug 8 is filled in the bit line contact hole 80. A bit line 9 is formed of a conductive material such as W. The bit line 9 is electrically connected to the bit line contact plug 8 through the bit line pad 9a. An interlayer insulating film 7b covers the bit line 9.

Furthermore, the capacitance contact hole 10 is formed on the capacitor diffusion layer 5 through the interlayer insulating films 7a and 7b, and a capacitance contact plug 11 is buried in the capacitance contact hole 10. The capacitance contact plug 11 includes an $N^+$-type doped polysilicon. A lower electrode 12 electrically connected to the capacitance contact plug 11 is formed, and a cylinder type electrode 13 connected to the lower electrode 12 is formed. The cylinder type electrode 13 is formed of a very thin $N^+$-type doped polysilicon film with a thickness of about 100 nm. A capacitance insulating film 14 is formed on the surfaces of the cylinder type electrode 13 and the lower electrode 12, and a plate electrode 15 is fixed to the capacitance insulating film 14.

In this way, a DRAM cell having one transistor and one capacitor provided with the storage electrode of cylinder structure is formed.

Next, a method of forming a stacked capacitor, which is the point of the present invention, will be concentrically described.

FIGS. 2A to 2H show the case where a TiN film is used as a film for shaping an electrode.

It should be noted that in FIGS. 2A to 2H, the diffusion layer, the word line and the like shown in FIG. 1B are omitted.

Figure 2A:
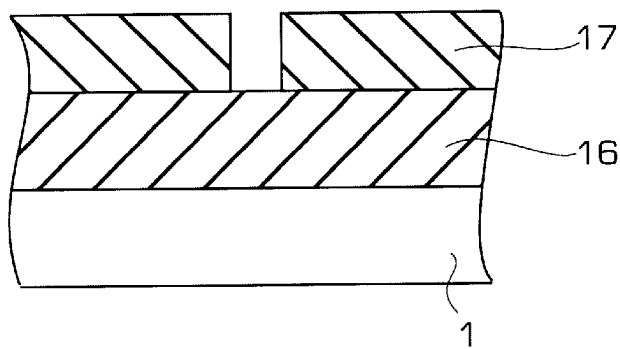
FIGS. 2A to 2H are sectional views showing steps of forming a stacked capacitor according to the first embodiment of the present invention.

As shown in FIG. 2A, a borophosphosilicate glass (hereinafter referred to as BPSG) film 16 with a thickness of 5,000 Å is deposited on a silicon substrate 1 by a normal pressure CVD method using silan ($SiH_4$) gas, phosphine ($PH_3$) gas, diborane ($B_2H_6$) gas, and oxygen ($O_2$) gas. The film is annealed in a nitrogen atmosphere at 800° C. for 30 minutes, and a resist 17 is coated thereon and patterned.

Figure 2B:
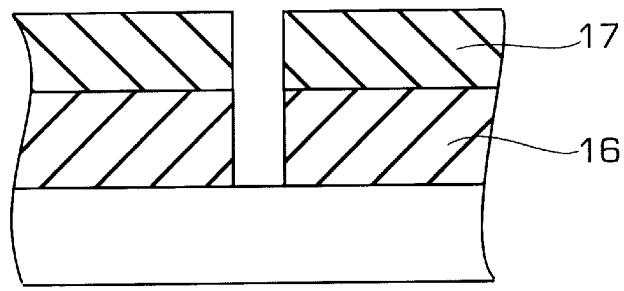

As shown in FIG. 2B, the BPSG film 16 as an interlayer insulating film is etched by a dry etching treatment using the resist 17 as a mask.

Figure 2C:
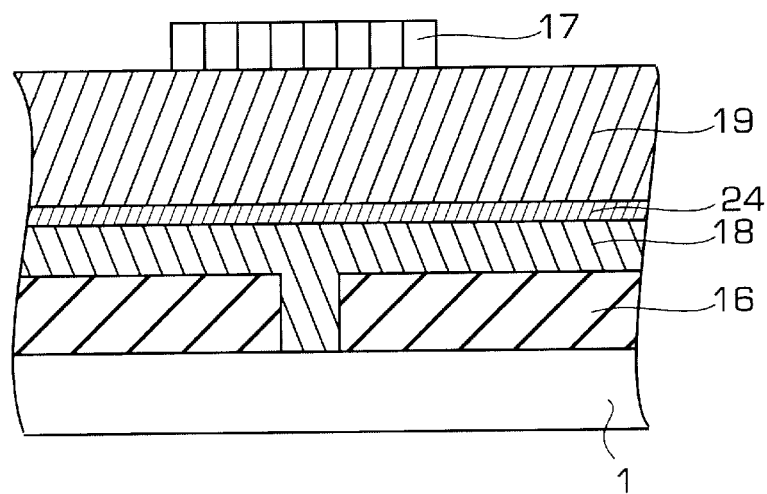

As shown in FIG. 2C, a phosphorus doped silicon film 18 with a thickness of 1,000 Å is deposited by an LPCVD method. A TiN film 19 with a thickness of 4,000 Å is deposited on the film 18 by a sputtering method. A resist 17 is coated on the TiN film 19. Here, although the sputtering method is used as the deposition method of the TiN film 19, a thermal CVD method may be used to deposit the film or a plasma CVD method may be used. Any other methods may be used as long as the TiN film 19 is deposited.

Figure 2D:
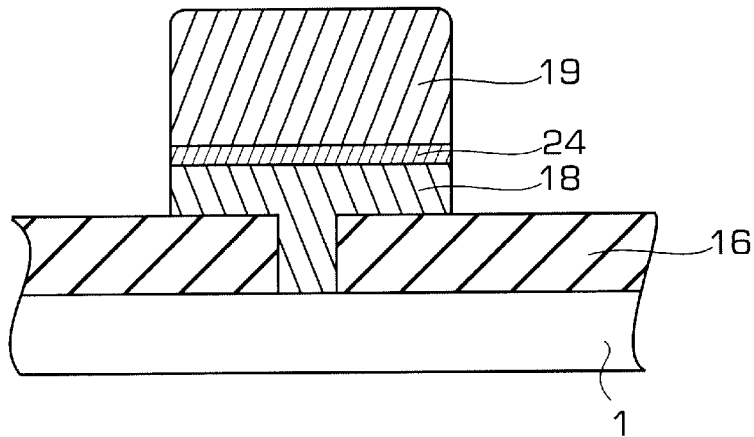

As shown in FIG. 2D, the TiN film 19 and the phosphorus doped silicon film 18 are dry etched using the resist 17 as a mask. Next, the resist 17 is peeled off by an oxygen plasma treatment and an organic treatment, and the surface is cleaned. However, a HF solution or washing in water may be used to clean the surface of an electrode after the etching treatment.

Figure 2E:
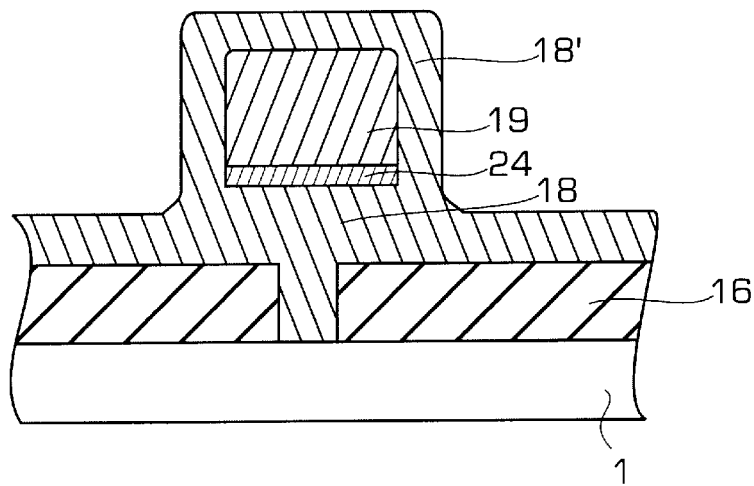
Figure 2F:
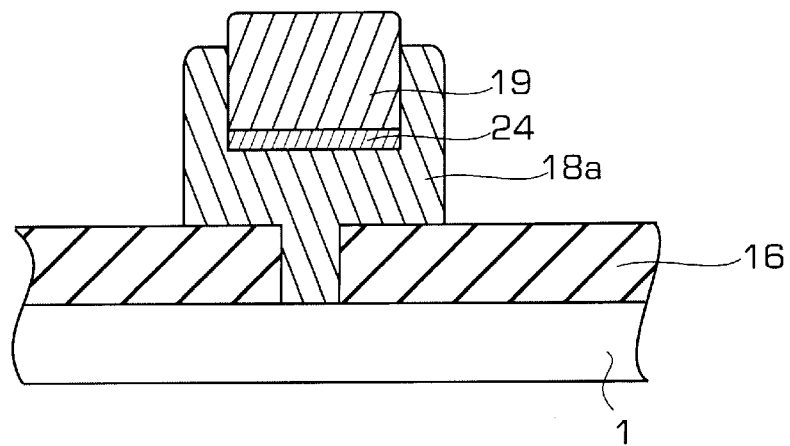

As shown in FIG. 2E, a phosphorus doped silicon film 18' is again deposited, and an anisotropic etching treatment of polysilicon is carried out. According to this, the phosphorus doped silicon film 18' on the BPSG film 16 as the interlayer insulating film and on the TiN film 19 is removed. However, as shown in FIG. 2F, the phosphorus doped silicon film 18' deposited on the side surface of the TiN film 19 remains. The remaining portion will be referred to as a side wall electrode 18a.

Figure 2G:
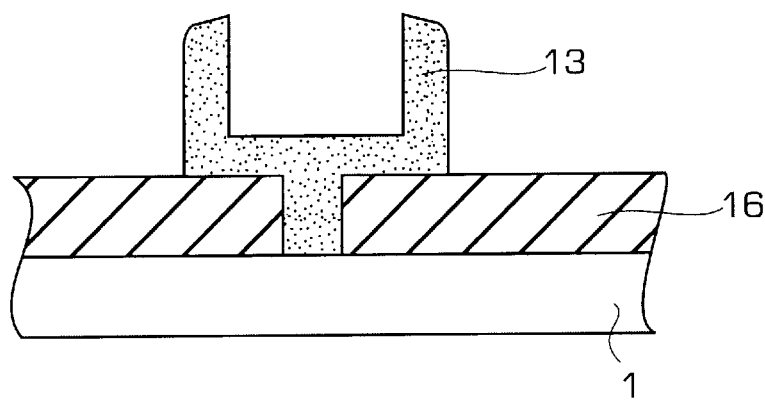

As shown in FIG. 2G, the TiN film 19 inside the side wall electrode 18a is removed. Specifically, the TiN is removed by using a sulfuric acid solution heated to 60° C. It was confirmed that after etching treatment for 5 minutes, the TiN film was completely removed. Accordingly, it is understood that an etching rate of TiN is higher than 800 Å/minute.

On the other hand, the BPSG film 16 is not etched by sulfuric acid. Thus, by using this method, the cylinder type electrode 13 can be formed while etching of the BPSG film 16 as the interlayer insulating film is completely suppressed. At this time, the side wall electrode 18a shown in FIG. 2F contributes to the increase of an electrode area. Accordingly, without increasing the area of the capacitor formation portion on the silicon substrate 1, large storage capacitance required for the operation of a device can be obtained.

Figure 2H:
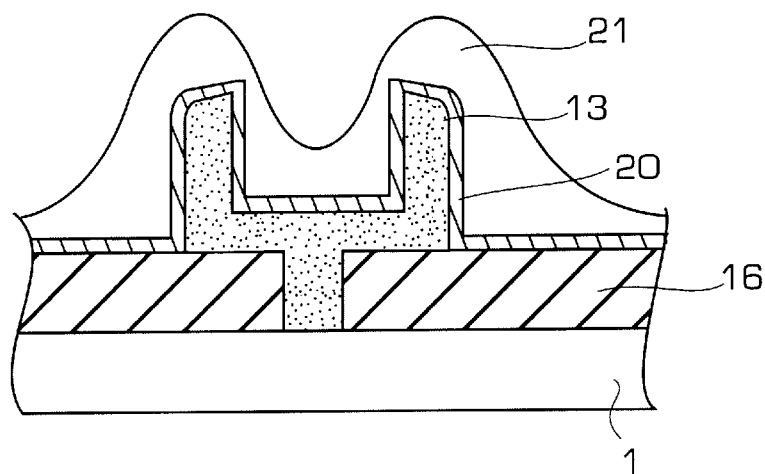

As shown in FIG. 2H, after the surface of the cylinder type electrode 13 is cleaned, the electrode is subjected to a heat treatment in an ammonia atmosphere to thermally nitrify the surface of the cylinder type electrode 13 by a thickness of about 15 Å. Thereafter, a silicon nitride film of about 55 Å is deposited by a thermal CVD method and is subjected to an oxidizing treatment in a oxidizing furnace, so that a capacitance insulating film 20 of $SiO_2/Si_3N_4$ structure is formed. A phosphorus doped polysilicon film is deposited by a CVD method, and is subjected to electrode shaping, so that an upper electrode 21 is formed. In this way described above, the capacitor of cylinder structure is formed.

In the first embodiment, when the TiN film used for shaping the cylinder type electrode is removed, although the sulfuric acid solution heated to 60° C. is used, other liquid may be used. As the liquid, a solution containing at least one selected from sulfuric acid, nitric acid, hydrochloric acid, phosphoric acid, hydrogen peroxide, and ammonia is suitable. Since an etching time can be shortened by heating, a throughput can be improved by using the heated liquid. However, since the above solution has sufficient etching properties even at a room temperature, if the throughput is not important, the liquid can be used at a room temperature.

In the formation of the cylinder type electrode, instead of TiN film, other refractory metal film such as W film or a high melting point metal may be used.

FIGS. 3A to 3F are sectional views showing steps of forming a fin-structured stacked capacitor in which W is used as a film for shaping an electrode.

Also in FIGS. 3A to 3F, the diffusion layer, the word line and the like are omitted like FIGS. 2A to 2H.

Figure 3A:
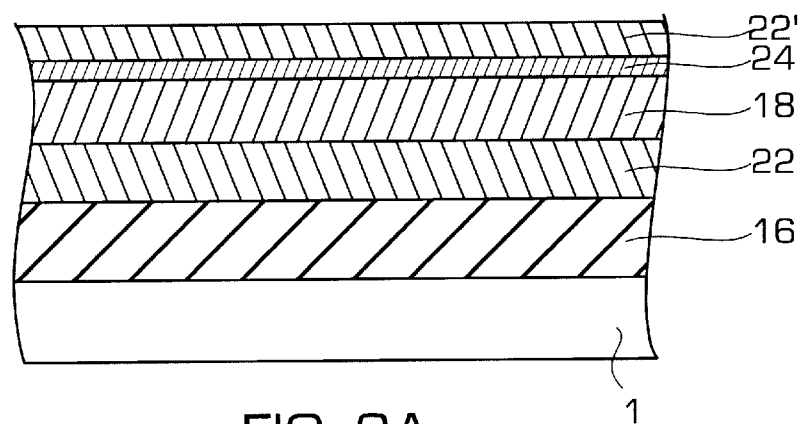
FIGS. 3A to 3F are sectional views showing steps of forming a stacked capacitor according to a second embodiment of the present invention.

As shown in FIG. 3A, similarly to the case of the first embodiment, a BPSG film 16 with a thickness of 5,000 Å is deposited on a silicon substrate 1. A W film 22, a phosphorus doped silicon film 18, and a W film 22' are deposited on the film 16 in the stated order by the unit of 1,000 Å, respectively. A resist (not shown) is coated on the film 22' and is patterned.

Figure 3B:
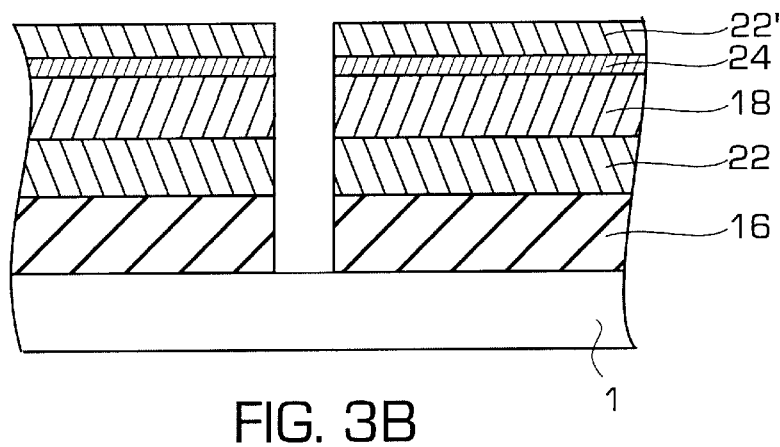

As shown in FIG. 3B, the upper W film 22', the phosphorus doped silicon film 18, and the lower W film 22 are etched by a reactive dry etching treatment using the resist as a mask, and finally, the BPSG film 16 as the interlayer insulating film is etched. According to this, a contact hole reaching the silicon substrate 1 is formed.

Figure 3C:
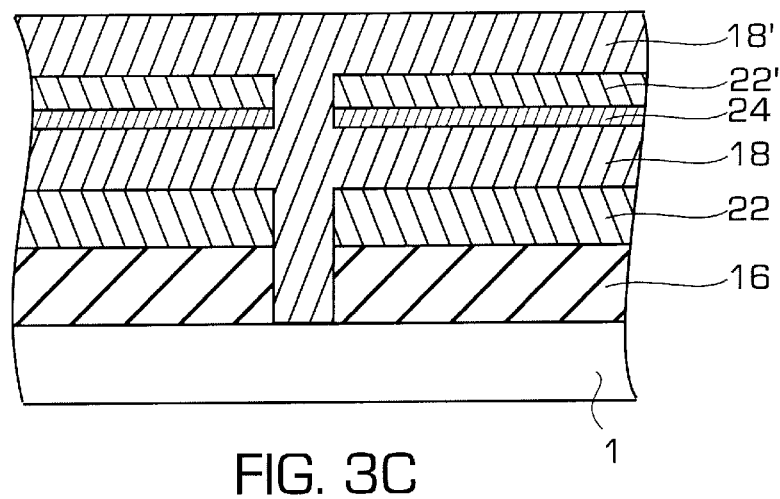

As shown in FIG. 3C, the resist on the upper W film 22' is removed, and a phosphorus doped silicon film 18' with a thickness of 1,000 Å is deposited and is also buried in the contact hole.

Figure 3D:
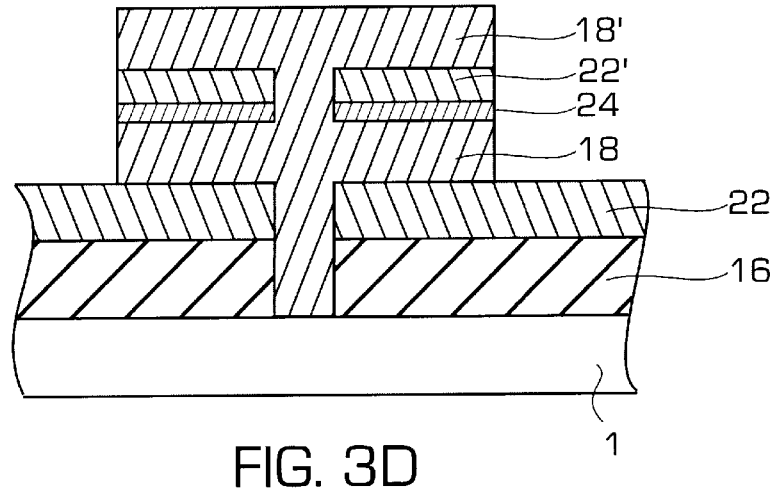

As shown in FIG. 3D, by a dry etching treatment, an anisotropic etching treatment is carried out using a resist as a protecting film, and etching is carried out until the films on the lower W film 22 are etched away, so that the pattern of the stack electrode is formed.

Figure 3E:
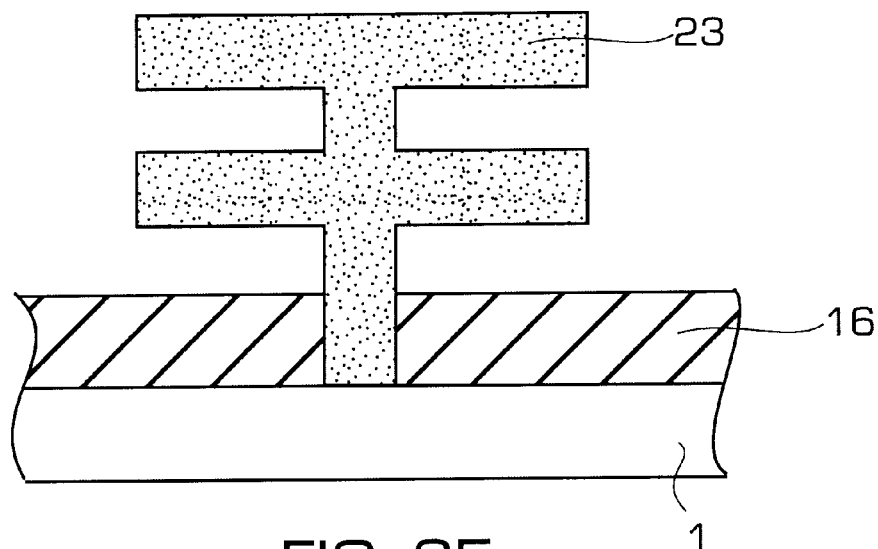

As shown in FIG. 3E, the W films 22, 22' between the electrodes formed of the phosphorus doped silicon films 18, 18' and the W films 22, 22' at the lower portion of the electrode are removed. Specifically, the W films are removed by using a mixed solution of nitric acid and sulfuric acid heated to 60° C. It was confirmed that after the etching treatment for 10 minutes, the W film was completely removed. Thus, it is understood that the etching rate of W is higher than 1,000 Å/minute.

On the other hand, the BPSG film 16 is not etched by the mixed solution of nitric acid and sulfuric acid. Accordingly, by using this method, a fin type electrode 23 can be formed while the etching of the BPSG film 16 as the interlayer insulating film is completely suppressed. At this time, fin portions of the phosphorus doped silicon films 18, 18' shown in FIG. 3D contribute to the increase of an electrode area. Thus, without increasing the area of a capacitor formation portion on the silicon substrate 1, large storage capacitance required for the operation of a device can be obtained.

Figure 3F:
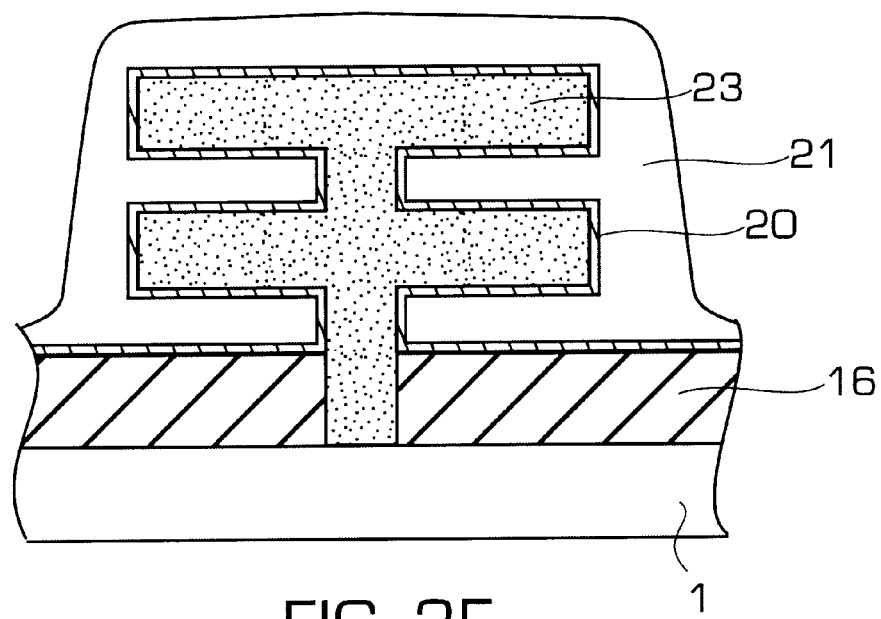
Figure 4A:
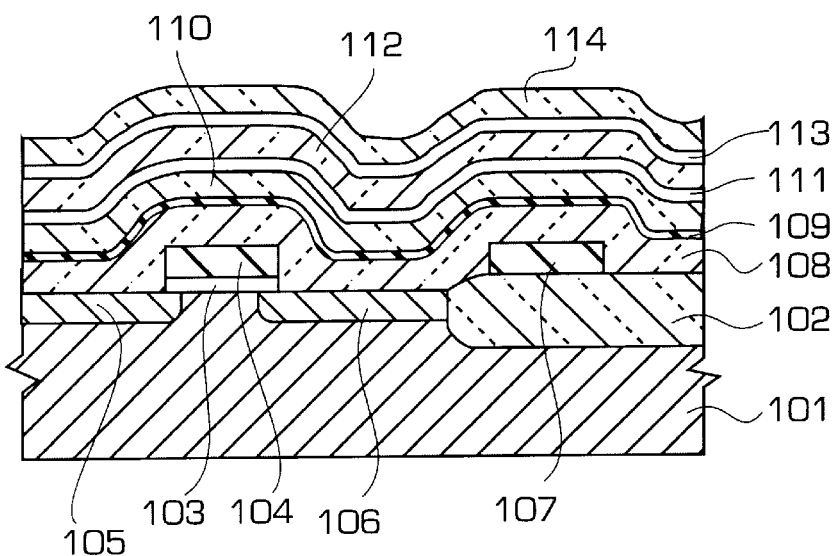
FIGS. 4A to 4F are sectional views showing steps of forming a fin-structured capacitor according to a first prior art.
Figure 4B:
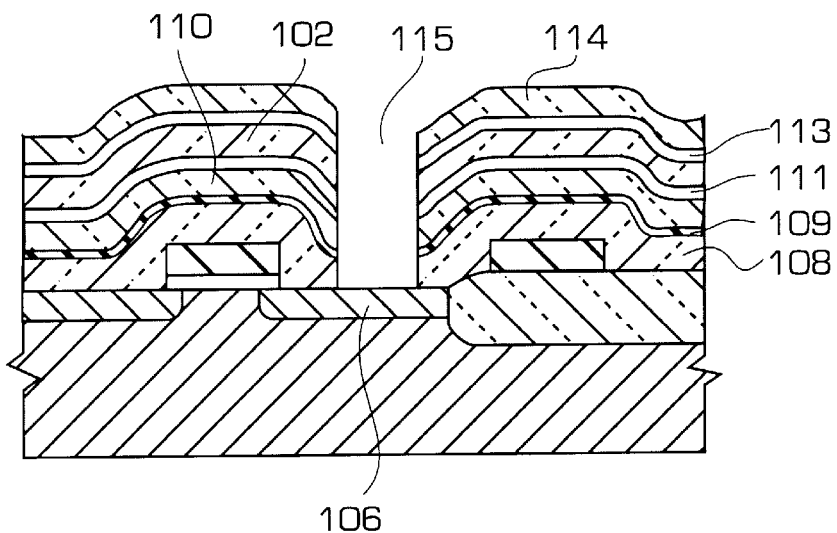
Figure 4C:
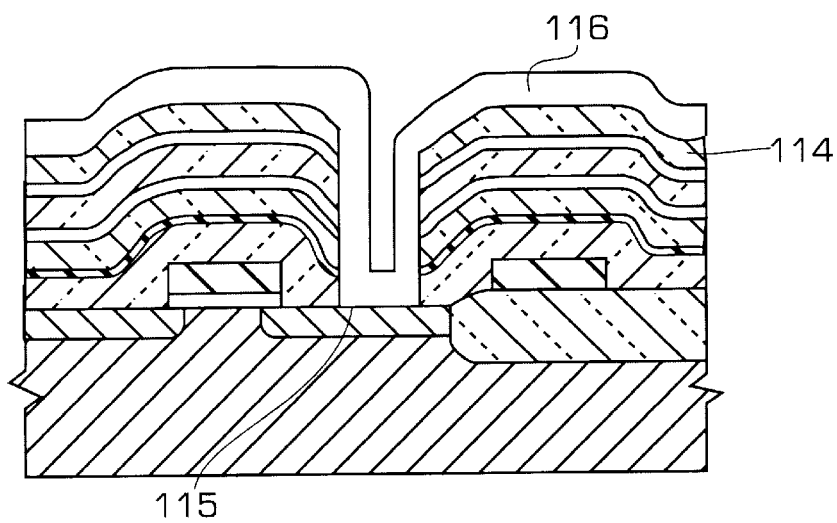
Figure 4D:
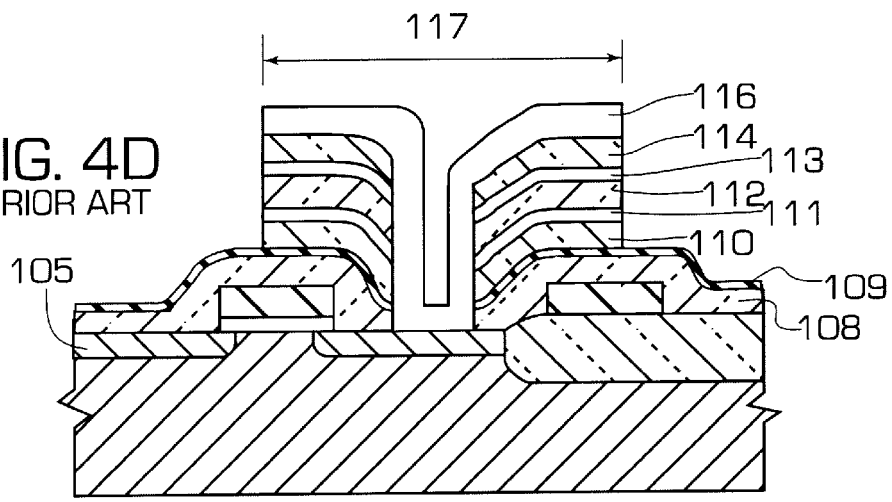
Figure 4E:
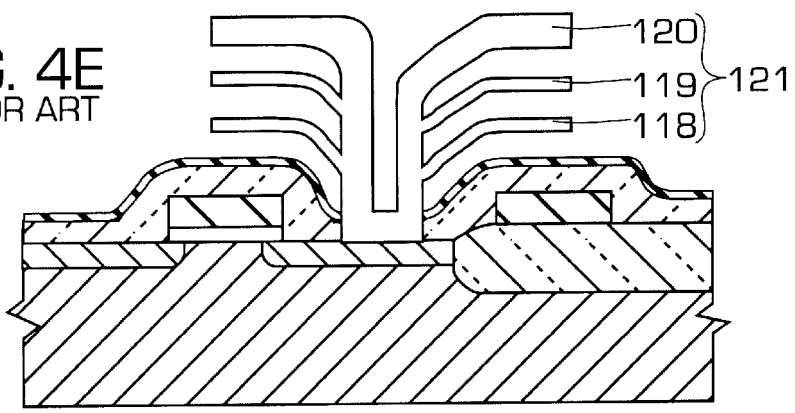
Figure 4F:
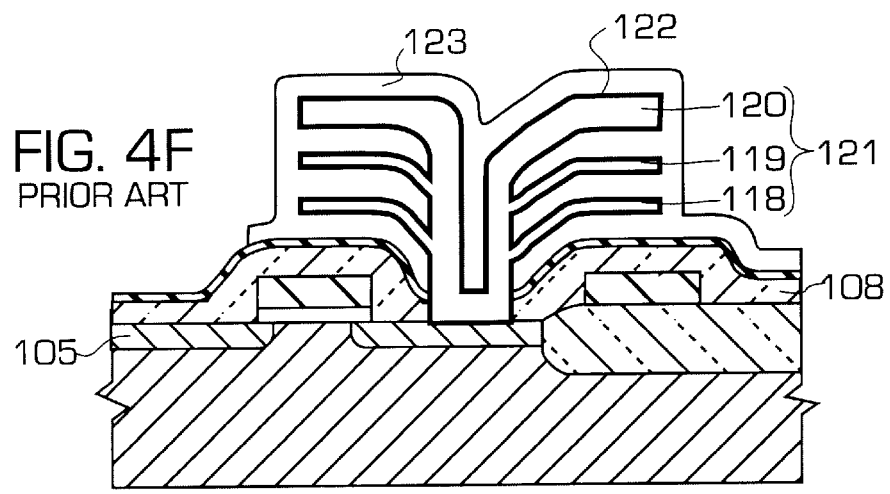

As shown in FIG. 3F, after the surface of the fin type electrode 23 is cleaned, a heat treatment is carried out in an ammonia atmosphere to nitrify the surface of the fin type electrode 23 by a thickness of 15 Å. Thereafter, a silicon nitride film with a thickness of about 55 Å is deposited by a thermal CVD method, and a pyrogenic oxidizing treatment is carried out at 850° C. for 30 minutes in an oxidizing furnace, so that a $SiO_2/Si_3N_4$ film 20 is formed. A phosphorus doped polysilicon film is deposited by a CVD method, and electrode shaping is carried out so that an upper electrode 21 is formed. In this way, the fin-structured capacitor is formed.

In the second embodiment, when the W film 22 used for shaping a fin type electrode is removed, although the mixed solution of nitric acid and sulfuric acid is used, other liquid may be used. As the liquid, a solution containing at least one selected from sulfuric acid, nitric acid, hydrochloric acid, phosphoric acid, hydrogen peroxide, and ammonia is suitable. Since an etching time can be shortened by heating etching time, a throughput can be improved by using the heated liquid. However, since the above solution has sufficient etching properties even at a room temperature, if the throughput is not important, the solution can be used at a room temperature.

Further, other refractory metal film such as TiN film instead of W film or a high melting point metal film may be used for formation of the fin type electrode.

Although, in some case where W is used or TiN is used, the surface of a silicon electrode may be roughened according to a process temperature, any problem in a device application does not occur. Rather, since an electrode area is increased by the roughness of the surface, an advantage that storage capacitance is increased can be obtained.

In the present invention, further, an adhesion improvement film 24 may be formed on a silicon film as a capacitor electrode film to prevent the high melting point metal film from peeling off the silicon film. For example, as one of methods for improving the adhesion of a W film to a silicon film, (W film/)TiN/Ti silicide film(/silicon film) may be used as the adhesion improvement film 24.

However, it is preferable that the adhesion improvement film be removed at the time when the high melting point metal film is removed or after the high melting point metal film is removed. This is because the tolerance for electrical stress of a silicon nitride film, which is the capacitor insulating film, is higher on the silicon film than on the adhesion improvement film as the TiN film.

Further, before the silicon film is deposited on the high melting point metal film, the surface treatment as a nitridation or an oxidation or a silicidation of the high melting point metal film may be performed. According to this, it becomes possible to suppress reacting the high melting point metal with the silicon film. Thus, a highly reliable capacitor can be provided.

Furthermore, for increasing a capacitor electrode area, an unevenness as hemispherical grains may be formed on the surface of the capacitor electrode film.

As described in detail above, according to a method of manufacturing a semiconductor device of the present invention, in the case where a silicon oxide film or a silicon oxide film containing impurities is used as an insulating film deposited at a lower portion of an electrode of a stacked capacitor, only the film such as a TiN film or a W film for shaping an electrode can be removed without etching the insulating film while a high etching selection ratio is maintained.

Accordingly, there is such an effect that a method of manufacturing a stacked capacitor of a semiconductor memory device without using an etching stopper film and using a specific etching process as a vapor phase HF treatment can be provided and a highly reliable device can be provided.

It is apparent that the present invention is not limited to the above embodiments but may be modified and changed without departing from the scope and spirit of the invention.

What is claimed is:

1. A method of manufacturing a semiconductor memory device, comprising the steps of:

forming an insulating film on a semiconductor substrate;

forming a high melting point metal film interposed between capacitor electrode films formed of silicon on said insulating film;

selectively etching at least one of said capacitor electrode films to expose at least a part of said high melting point metal film; and removing said high melting point metal film by wet etching.

2. The method of manufacturing a semiconductor memory device as claimed in claim 1, wherein said high melting point metal film is a TiN film.

3. The method of manufacturing a semiconductor memory device as claimed in claim 1, wherein said high melting point metal film is a W film.

4. The method of manufacturing a semiconductor memory device as claimed in claim 1, wherein said wet etching is performed using a solution containing at least one selected from sulfuric acid, nitric acid, hydrochloric acid, phosphoric acid, hydrogen peroxide, and ammonia.

5. The method of manufacturing a semiconductor memory device as claimed in claim 1, wherein said insulating film is a silicon oxide film or a silicon oxide film containing impurities.

6. The method of manufacturing a semiconductor memory device as claimed in claim 1, further comprising the steps of:

forming a capacitor insulating film on said capacitor electrode films; and forming a plate electrode on said capacitor insulating film.

7. The method of manufacturing a semiconductor memory device as claimed in claim 1, further comprising the step of:

forming an adhesion improvement film interposed between at least one of said capacitor electrode films and said high melting point metal film.

8. The method of manufacturing a semiconductor memory device as claimed in claim 7, wherein said adhesion improvement film is a TiN/Ti silicide film.

9. The method of manufacturing a semiconductor memory device as claimed in claim 1, further comprising the steps of:

performing surface treatment of said high melting point metal film to suppress reacting said high melting point metal with said capacitor electrode films.

10. The method of manufacturing a semiconductor memory device as claimed in claim 9, wherein said surface treatment is a nitridation or an oxidation or a silicidation.

11. A method of manufacturing a semiconductor memory device, comprising the steps of:

forming an insulating film on a semiconductor substrate;

forming a first capacitor electrode film on said insulating film;

forming a high melting point metal film having a top surface and a side surface on said first capacitor electrode film;

forming a second capacitor electrode film on said top surface and said side surface of said high melting point metal film;

selectively etching said second capacitor electrode film to expose said top surface of said high melting point metal film; and removing said high melting point metal film by wet etching.

12. The method of manufacturing a semiconductor memory device as claimed in claim 11, wherein said high melting point metal film is a TiN film.

13. The method of manufacturing a semiconductor memory device as claimed in claim 11, wherein said high melting point metal film is a W film.

14. The method of manufacturing a semiconductor memory device as claimed in claim 13, wherein said wet etching is performed using a solution containing at least one selected from sulfuric acid, nitric acid, hydrochloric acid, phosphoric acid, hydrogen peroxide, and ammonia.

15. The method of manufacturing a semiconductor memory device as claimed in claim 11, wherein said insulating film is a silicon oxide film or a silicon oxide film containing impurities.

16. The method of manufacturing a semiconductor memory device as claimed in claim 11, further comprising the steps of:

forming a capacitor insulating film on said first and second capacitor electrode films; and forming a plate electrode on said capacitor insulating film.

17. The method of manufacturing a semiconductor memory device as claimed in claim 11, further comprising the step of:

forming an adhesion improvement film interposed between said first capacitor electrode film and said high melting point metal film.

18. The method of manufacturing a semiconductor memory device as claimed in claim 17, wherein said adhesion improvement film is a TiN/Ti silicide film.

19. The method of manufacturing a semiconductor memory device as claimed in claim 11, further comprising the step of:

performing surface treatment of said high melting point metal film to suppress reacting said high melting point metal film with said second capacitor electrode film.

20. The method of manufacturing a semiconductor memory device as claimed in claim 19, wherein said surface treatment is a nitridation or an oxidation or a silicidation.

21. A method of manufacturing a semiconductor memory device, comprising the steps of:

forming an insulating film on a semiconductor substrate;

forming a high melting point metal film on said insulating film;

forming a contact hole in said high melting point metal film and said insulating film;

forming a capacitor electrode film on said high melting point metal film and in said contact hole;

selectively etching said capacitor electrode film to expose at least a part of said high melting point metal film; and removing said high melting point metal film by wet etching.

22. The method of manufacturing a semiconductor memory device as claimed in claim 21, wherein said high melting point metal film is a TiN film.

23. The method of manufacturing a semiconductor memory device as claimed in claim 21, wherein said high melting point metal film is a W film.

24. The method of manufacturing a semiconductor memory device as claimed in claim 21, wherein said wet etching is performed using a solution containing at least one selected from sulfuric acid, nitric acid, hydrochloric acid, phosphoric acid, hydrogen peroxide, and ammonia.

25. The method of manufacturing a semiconductor memory device as claimed in claim 21, wherein said insulating film is a silicon oxide film or a silicon oxide film containing impurities.

26. The method of manufacturing a semiconductor memory device as claimed in claim 21, further comprising the steps of:

forming a capacitor insulating film on said capacitor electrode film; and forming a plate electrode on said capacitor insulating film.

27. The method of manufacturing a semiconductor memory device as claimed in claim 21, further comprising the step of:

forming an upper high melting point metal film on said capacitor electrode film.

28. The method of manufacturing a semicoductor memory device as claimed in claim 27, further comprising the step of:

forming an adhesion improvement film interposed between said capacitor electrode film and said upper high melting point metal film.

29. The method of manufacturing a semiconductor memory device as claimed in claim 28, wherein said adhesion improvement film is a TiN/Ti silicide film.

30. The method of manufacturing a semiconductor memory device as claimed in claim 21, further comprising the step of:

performing surface treatment of said high melting point metal film to suppress reacting said high melting point metal with said capacitor electrode film.

31. The method of manufacturing a semiconductor memory device as claimed in claim 30, wherein said surface treatment is a nitridation or an oxidation or a silicidation.

* * * * *

UNITED STATES PATENT AND TRADEMARK OFFICE
CERTIFICATE OF CORRECTION

PATENT NO. : 6,054,360
DATED : April 25, 2000
INVENTOR(S) : Hirohito WATANABE

It is certified that error appears in the above-identified patent and that said Letters Patent is hereby corrected as shown below:

Column 7, line 17, after "example" insert --as shown in Figs. 2C and 3A--.

Signed and Sealed this

Tenth Day of April, 2001

Attest:

NICHOLAS P. GODICI

Attesting Officer    Acting Director of the United States Patent and Trademark Office